(12) United States Patent  
Margalit

(10) Patent No.: US 11,606,644 B2
(45) Date of Patent: Mar. 14, 2023

(54) SOUND GENERATION DEVICE AND APPLICATIONS

(71) Applicant: Mordehai Margalit, Zichron Yaaqov (IL)

(72) Inventor: Mordehai Margalit, Zichron Yaaqov (IL)

(73) Assignee: SONICEDGE LTD., Shoham (IL)

( * ) Notice: Subject to any disclaimer, the term of this patent is extended or adjusted under 35 U.S.C. 154(b) by 113 days.

(21) Appl. No.: 17/000,410

(22) Filed: Aug. 24, 2020

(65) Prior Publication Data

US 2021/0195335 A1 Jun. 24, 2021

Related U.S. Application Data

(60) Provisional application No. 62/952,508, filed on Dec. 23, 2019.

(51) Int. Cl.

| | |
|---|---|
| *H04R 5/04* | (2006.01) |
| *H04S 1/00* | (2006.01) |
| *H03G 3/24* | (2006.01) |
| *H04R 3/00* | (2006.01) |
| *H04S 7/00* | (2006.01) |

(52) U.S. Cl.
CPC ............. *H04R 5/04* (2013.01); *H03G 3/24* (2013.01); *H04R 3/005* (2013.01); *H04S 1/005* (2013.01); *H04S 7/30* (2013.01)

(58) Field of Classification Search
CPC ...... H04R 5/04; H04R 3/005; H04R 2203/12; H04R 2217/03; H04R 2499/13; H04R 2499/15; H04S 7/302; H04S 1/005; H04S 7/30; H03G 3/24; H04B 3/00; H04B 5/00

USPC .......................................................... 381/77, 79
See application file for complete search history.

(56) References Cited

U.S. PATENT DOCUMENTS

| | | | |
|---|---|---|---|
| 6,678,381 B1 * | 1/2004 | Manabe | H04R 3/12 381/98 |
| 7,319,763 B2 * | 1/2008 | Bank | H03F 3/2173 330/10 |
| 7,536,019 B2 | 5/2009 | Putti et al. | |
| 8,027,488 B2 * | 9/2011 | Pompei | H04R 3/12 381/112 |
| 8,861,752 B2 | 10/2014 | Margalit | |

(Continued)

FOREIGN PATENT DOCUMENTS

EP 3133474 * 2/2017 ............. G06F 3/043

*Primary Examiner* — Xu Mei
(74) *Attorney, Agent, or Firm* — Manelli Selter PLLC; Edward Stemberger

(57) ABSTRACT

An audio system includes at least one sound generation device having at least an acoustic transducer; and an electronic integrated circuit. A communication bus is connected to the at least one sound generation device and is configured to communicate a digital signal comprised of one or more audio streams and control signals. A power bus is connected to the at least one sound generation device. The acoustic transducer includes at least one of the following groups: a membrane and an acoustic modulator; or a membrane, acoustic resonator, and acoustic coupler. The electronic integrated circuit is constructed and arranged to receive the digital signal and generate an analog electric signal to operate the acoustic transducer to generate an audio signal in accordance with the control signal.

12 Claims, 20 Drawing Sheets

(56) References Cited

U.S. PATENT DOCUMENTS

| | | | | |
|---|---|---|---|---|
| 2008/0285777 A1* | 11/2008 | Pompei | ............... | G10K 15/02 |
| | | | | 381/116 |
| 2012/0250913 A1* | 10/2012 | Sander | ............... | H04R 1/1083 |
| | | | | 704/226 |
| 2017/0262252 A1* | 9/2017 | Pelland | ............... | G06F 3/162 |
| 2018/0152783 A1* | 5/2018 | Barmoav | ............... | H04R 1/323 |

* cited by examiner

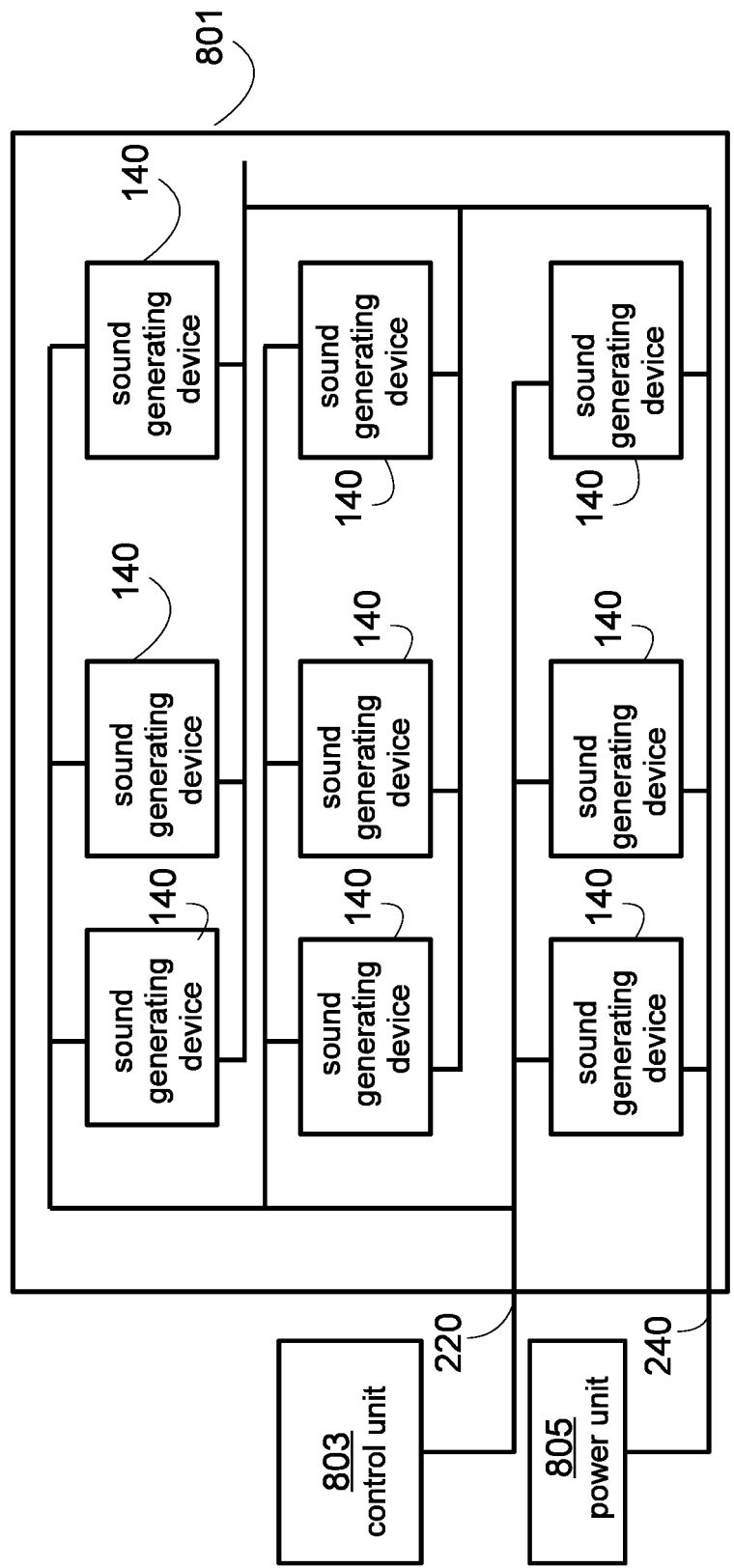

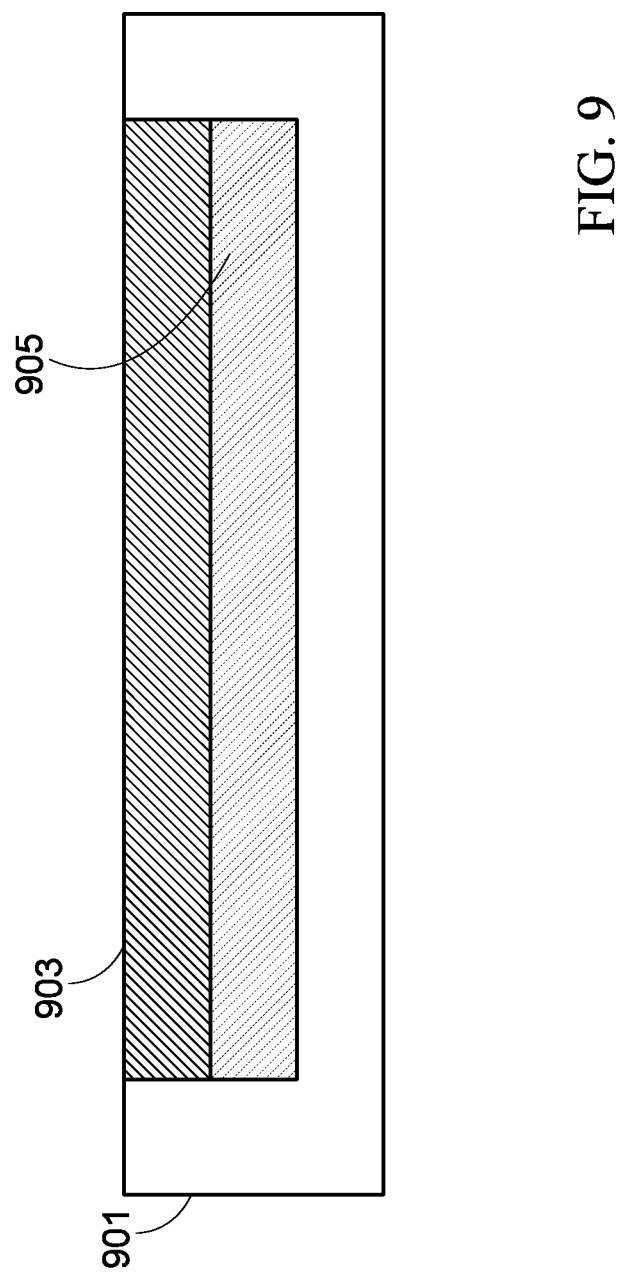

SOUND GENERATION DEVICE AND APPLICATIONS

BACKGROUND

Audio system aim to create sound with specific temporal, spectral and spatial characteristics. To achieve this goal, audio systems incorporate one or more speaker units. Multiple speakers are optimized for spectral and spatial response and the audio system allocates sound signals to specific speakers to create the target sound characteristics. In many applications the location of the speakers are optimized to provide the required response. In an automobile audio system, the size of speakers limits their placement and their limited frequency response hampers their ability to create a common sound signal for all car passengers as noted in U.S. Pat. No. 7,536,019. A speaker which provides a low form factor, flat frequency response and high electrical to acoustic conversion efficiency enables new forms of audio systems. Such systems can provide an enhanced audio experience in automobiles, house and rooms, mobile devices, wearable computing elements including clothing items such as scarves or glasses and even in large spaces or outdoors.

U.S. Pat. No. 8,861,752 describes a speaker device for generating audio signals which has several unique features; the frequency response is constant across the audio frequencies; very small form factor; low cost; high electrical to acoustical conversion efficiency leading to reduced power consumption by the speaker device. In U.S. Pat. No. 8,861,752 the speaker device is operated with two electrical connections and a common ground. The audio signal is derived from the electrical signals operating the device. It is common for audio signals to be generated from two or more sources. The sources can have either different spectral or spatial characteristics. For devices such as U.S. Pat. No. 8,861,752 with a flat frequency response the multiple sources have the same frequency response but different spatial characteristics such as location or beam pattern. Examples of applications of use include stereo sound, surround sound and localized beam patterns. Using the electrical connection described in U.S. Pat. No. 8,861,752 results in a complex system requiring multiple wires connected to each audio device and a central system to control the multiple devices. Hence it is desired to provide a more efficient means of connecting and operating one or more audio generating devices.

GLOSSARY

"audio signals" as used in the current disclosure means sound pressure waves ranging from 10 Hz to 45K Hz.

"audio generating device"—as used in the current disclosure means a device to generate audio signals.

"acoustic signal" as used in the current disclosure means sound pressure waves ranging from 20 Hz to 5 MHz.

"acoustic transducer" as used in the current disclosure means a device to generate audio or ultrasound signals.

"controller" or "electronics integrated circuit"—as used in the current disclosure means a device that receives and outputs analog or digital electrical signals and includes logic or microprocessor units to process the input or output signals "drive signal"—as used in the current disclosure means an electric analog signal. One or more of the drive signals are used to operate an audio generating device "analog signal"—as used in the current disclosure means a time varying electric analog signal which can have any voltage or current value within a range of values "digital signal"—as used in the current disclosure means a time varying electric digital signal which can have either of two voltage or current values.

"audio system" as used in the current disclosure means a system for generating audio signals and in some examples includes one or more audio generating devices and one or more controllers "background sound signals" or "background noise" as used in the current disclosure means audio signals which are present when the audio system is not operating.

"communication bus" as used in the current disclosure means a means of communicating between one or more devices. Communication buses are any of but not limited to; wire; multiple wires; wireless; optical and others.

"power bus" as used in the current disclosure means a method or providing electrical power to one more audio generating devices.

DESCRIPTION OF FIGURES

FIG. 8B is a further example of the schematic of an audio unit;

FIG. 9 is an example of side view of an audio system;

DESCRIPTION

Figure 1:
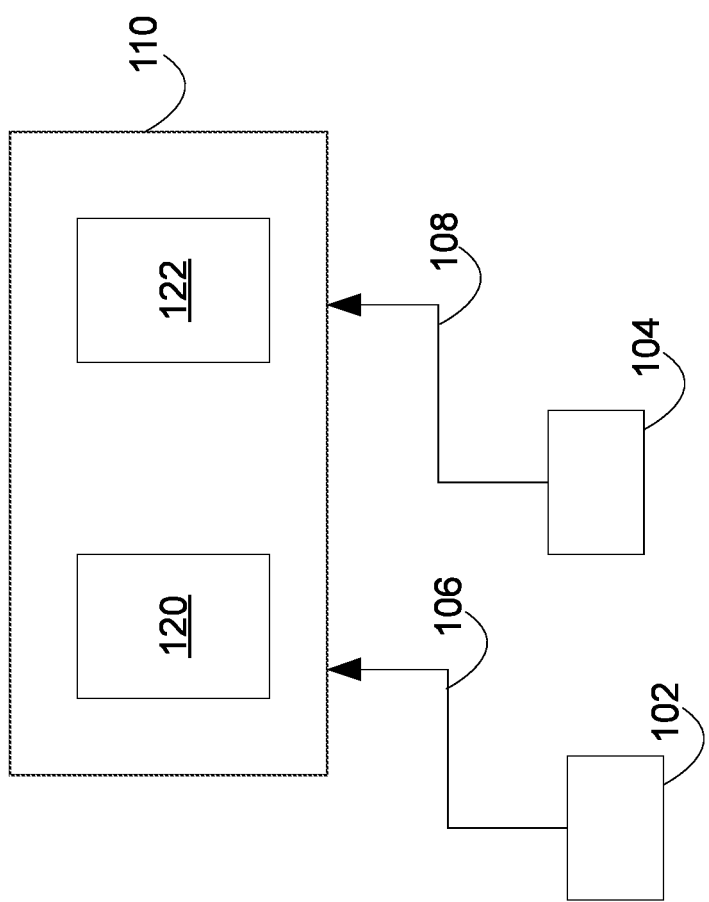
FIG. 1 is an example of a state of art audio generating device as described in U.S. Pat. No. 8,861,752.

FIG. 1 is an example of a state of art audio generating device as described in U.S. Pat. No. 8,861,752. The device is operated by two drive signals marked as 102 and 104, through the electrical connection 106 and 108 respectively, to the acoustic transducer 110. In U.S. Pat. No. 8,861,752, audio generating device 110 generates audio by generating and subsequently modulating an ultrasound signal. In one example audio generating device 110 includes a membrane 120 for generating the ultrasound signal and acoustic shutter 122 for modulating the ultrasound signal and generating an audio signal. In an alternative example disclosed in unpublished application, audio generating device includes a membrane 120 for generating an ultrasound signal, said membrane is contained in an acoustic resonator; an acoustic shutter modulates the acoustic coupling between said acoustic resonator and air surrounding the acoustic resonator and generates an audio signal.

Figure 2:
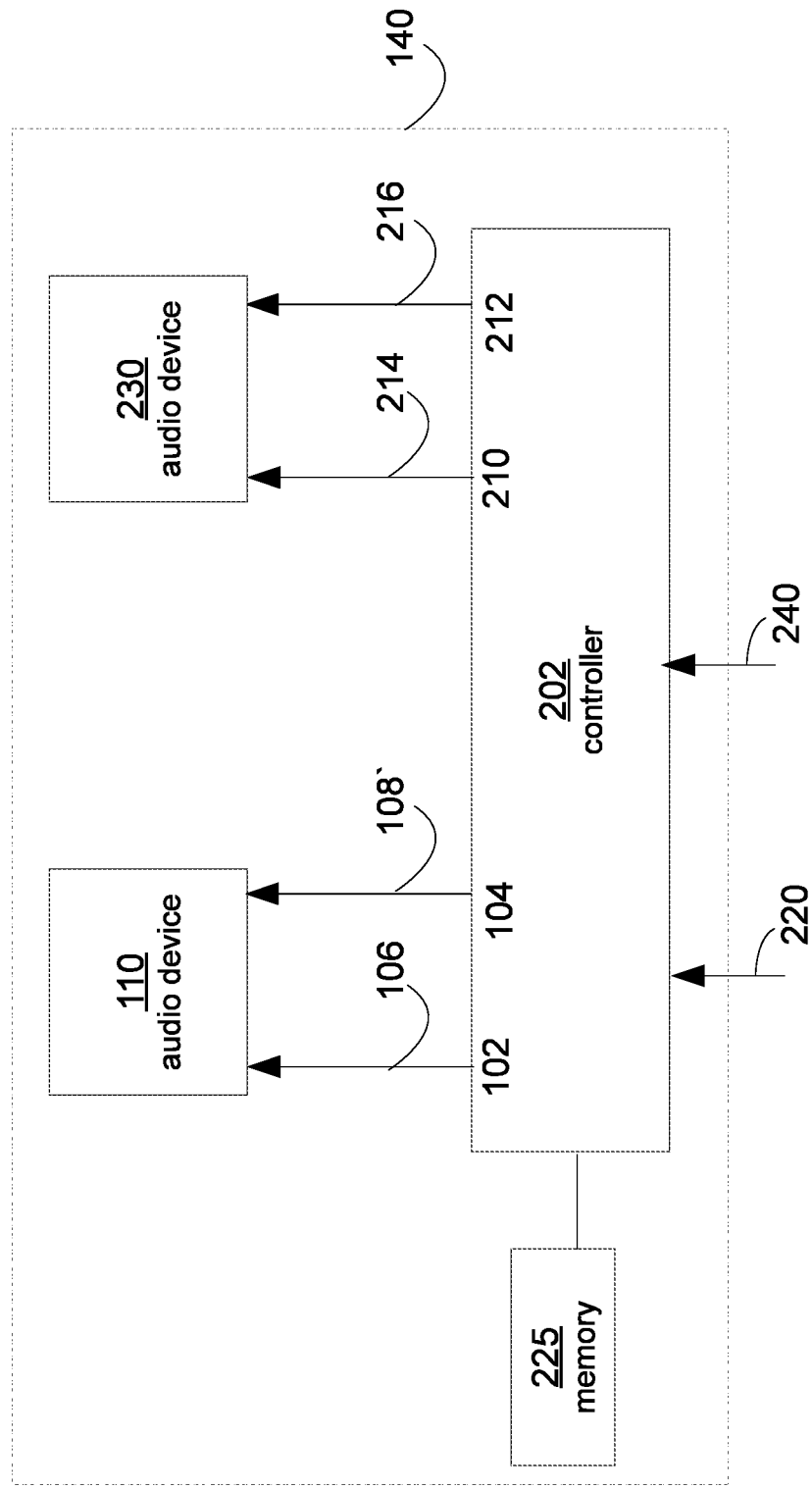
FIG. 2 is an example of a digital audio device.

FIG. 2 is an example of a digital audio device which includes; one or more audio generating devices 110, 230 which generate audio by generating and subsequently modulating an ultrasound signal and which are connected to a controller 202. The controller is an electronic integrated circuit and is realized in semiconducting manufacturing techniques and provides the required drive signals marked as 102, 104, 210, 212 to the acoustic transducers. In one example, the circuit has at least one communication bus 220 and one power bus 240. One or more audio signals, along with one or more control signals and one or more clock signals are encoded and provided as a digital signal to the electronic integrated circuit. The electronic integrated circuit separates the one or more control signals, the one or more audio signals and one or more clock signals. Examples of control signals include but are not limited to; the volume of the audio stream, the spectral characteristics of the audio stream, a nonlinear audio function such as timber or distortion, the direction of the sound, information pertaining to a specific sound device or any combination of these as well as other control information. In one example, the audio signals are processed according to the control signals to generate a first analog signal to drive the membrane and a second analog signal to drive acoustic shutter. The first analog signal activates the membrane and generates an acoustic signal. In one example the acoustic signal is predominantly a modulated ultrasound signal. In a further example, the modulated ultrasound signal has a carrier frequency above 100 KHz. The second analog signal activates the acoustic shutter to modulate the acoustic signal. In one example, the acoustic shutter is activated at the carrier frequency and the resulting modulated acoustic signal has the desired audio signal component. In one example the analog signal is any of but not limited to; Pulse width modulation signal; amplitude modulation signal; FM or PM modulated signal; SSB signal; CSB with suppressed carrier signal; including one or more frequencies. In examples where one or more devices are connected to the integrated electric circuit, the integrated electronic circuit provides the required drive signal pairs (membrane and acoustic shutter) to each device. In a further example the electrical connections 106, 108, 210, 212 are any of the following connections; a differential connection comprised of two wires with one voltage on one wire and a second voltage on a second wire; a two wire connection with one voltage on one wire and zero voltage or ground on the second wire; one wire with one voltage and a common ground or zero voltage. Examples of drive signals include; PWM modulation; variable voltage signals; other pulse modulation formats. In one example the drive signal activating the membrane will include an audio signal in one of the following formats; SSB; suppressed carrier; VSB around a center frequency fc. In a further example the shutter drive signal is any of a PWM signal; sinus signal; PWM with a duty cycle of 50%; PWM with duty cycle between 20-50%. In the aforementioned examples the said modulations are at the carrier frequency (fc).

In a further example the integrated electronic circuit also includes a nonvolatile memory unit marked as 225. The nonvolatile memory unit 225 maintains information pertaining to the audio generating devices 110, 230 such as their location and function. In another example the nonvolatile memory unit contains control instructions for generating specific traits from an audio generating device. For example, the drive audio stream sent to a specific device can be defined by control elements in the nonvolatile memory unit to have specific traits such as direction, nonlinear characteristics, spectral characteristics or certain types of delay. In this manner, an audio generating system composed of one or more audio generating device 110, 230 and at least one or more controllers is programmed to provide certain audio characteristics to any sound signal that they generate. Hence we describe an audio system comprising at least one acoustic transducer; an electronic integrated circuit; a digital signal comprised of one or more audio streams and control signals; wherein the electronic circuit receives the digital signal and generates an analog electric signal to operate the acoustic transducer to generate the audio stream in accordance with the control signal. In a further example the audio transducer includes at least two at least two elements, a membrane 120 and an acoustic shutter 122. In a further example the digital audio device has a unique identification code. In one example the code is configured in the controller using a one-time nonvolatile memory, dip switches, or other similar and well established techniques. Alternatively, the unique identification code is encoded in the nonvolatile memory unit 225. Examples of protocols for compound digital signal include I2S, I2C, CAN BUS, Ethernet, USB, PCI, or similar electrical serial bus interface standards. In a further example a controller 202 is connected to additional auxiliary devices or components including any but not limited to; GPS; clock; accelerometer; gyro; compass; barometer; temperature detector; other environmental detectors; LEDS or other lighting controllers; a memory chip or external memory device. In an additional example the controller further includes or is connected to any of but not limited to a digital signal processor; graphic processor; microprocessor; microcontroller; RISC machine; programmable logic controller; ASIC; FPGA.

Figure 3:
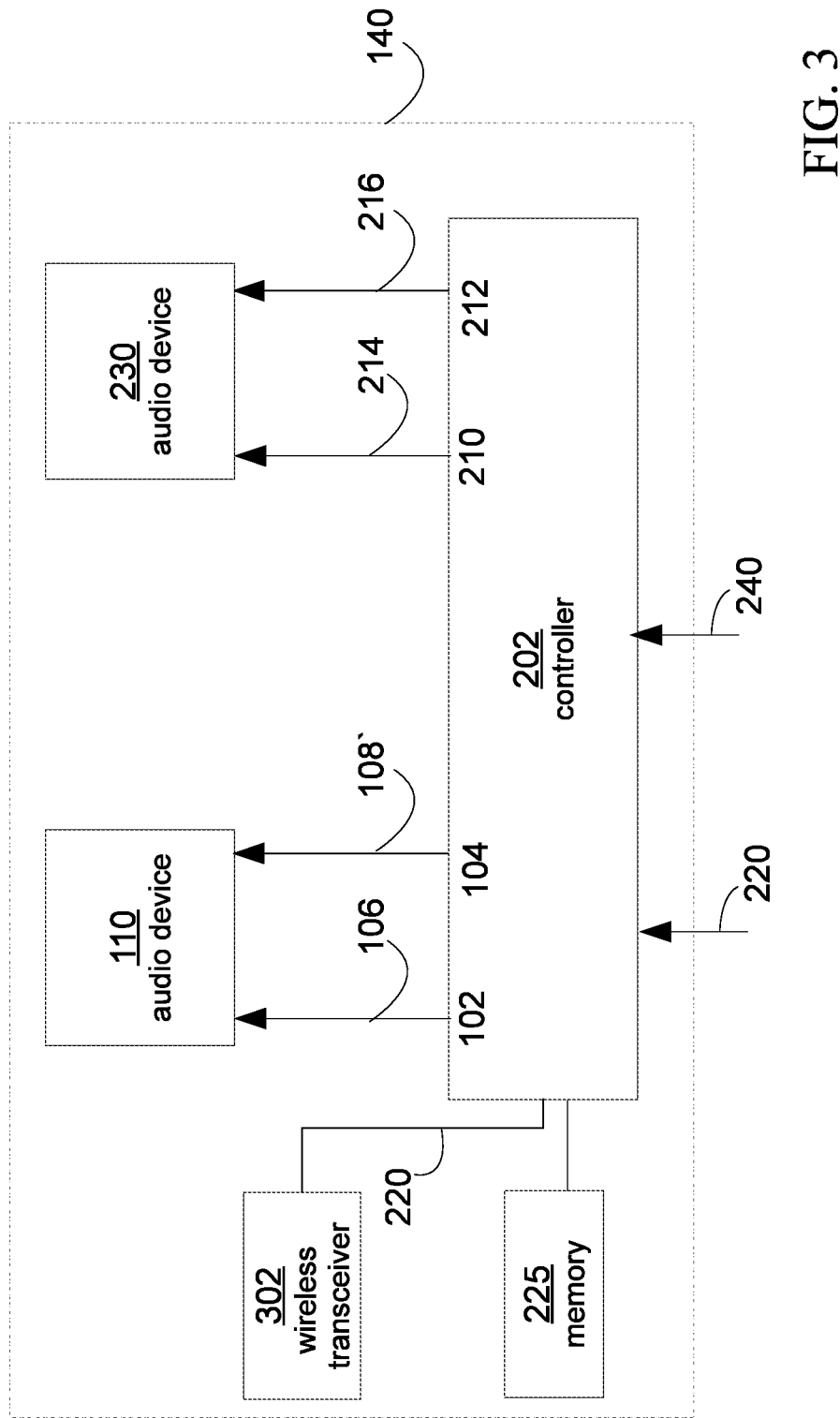
FIG. 3 is a further example of a digital audio device.

FIG. 3 is a further example of a digital audio device, where the compound digital signal is transmitted using a wireless protocol such as WiFi, Bluetooth, LTE, Zigbee or a proprietary protocol. In one example a wireless transceiver 302, is connected to the controller, 202. In a further example the compound digital signal is sent by a wireless transmission to one or more controller (202) units, each identified with a unique identification number. In a further example a plurality of digital audio devices are operated with a multicast wireless transmission, where each device operation or audio may be tailored by addressing aspects of the transmission to a specific device identification number. In one example one device located at one location transmits one audio signal with one control setting and a second device located in a second location transmits any or all of the following; the first audio signal with a second control setting, a second audio signal with a second control setting, a second audio signal with the first control setting. Examples of control settings include but are not limited to; delay; sound volume; timber; treble; bass; frequency specific amplification or spectral manipulation; reverberation; echo; distortion or any other sound effects.

Figure 4:
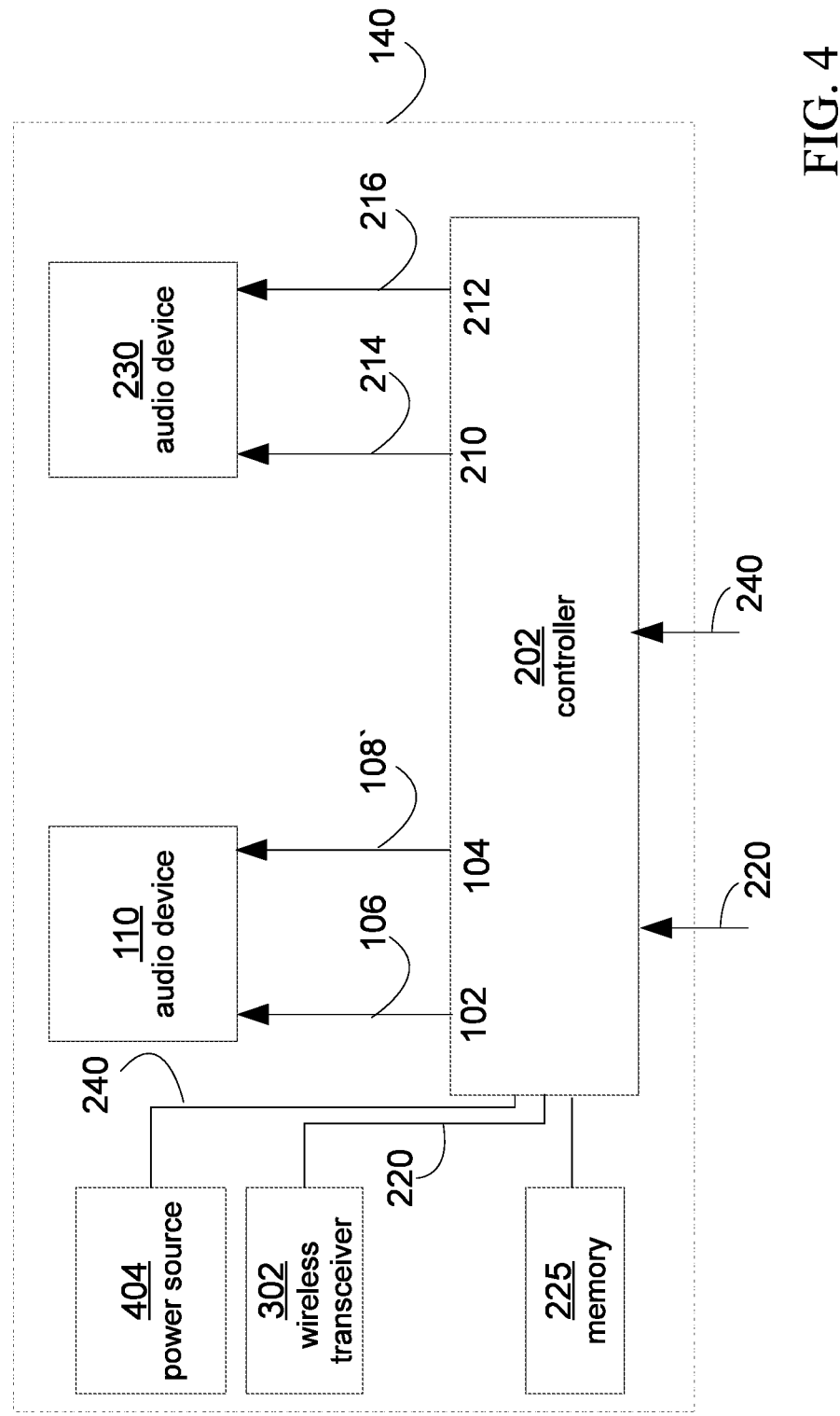
FIG. 4 is an example of digital audio device.

FIG. 4 is an example of digital audio device where the audio generating device comprises an audio generation device 108, 230, a controller, 202, and an electric power source 404. Examples of power source include but are not limited to a battery; vibrational power generator; or photo voltaic power generator; transformer; AC or combination of these sources. The power source is connected via power bus 240 to the controller. In one example the power bus is connected also externally top provide an option for any off but not limited to external power or charging power of the power source 404. In a further example the charging power connection is a wireless connection.

Figure 5:
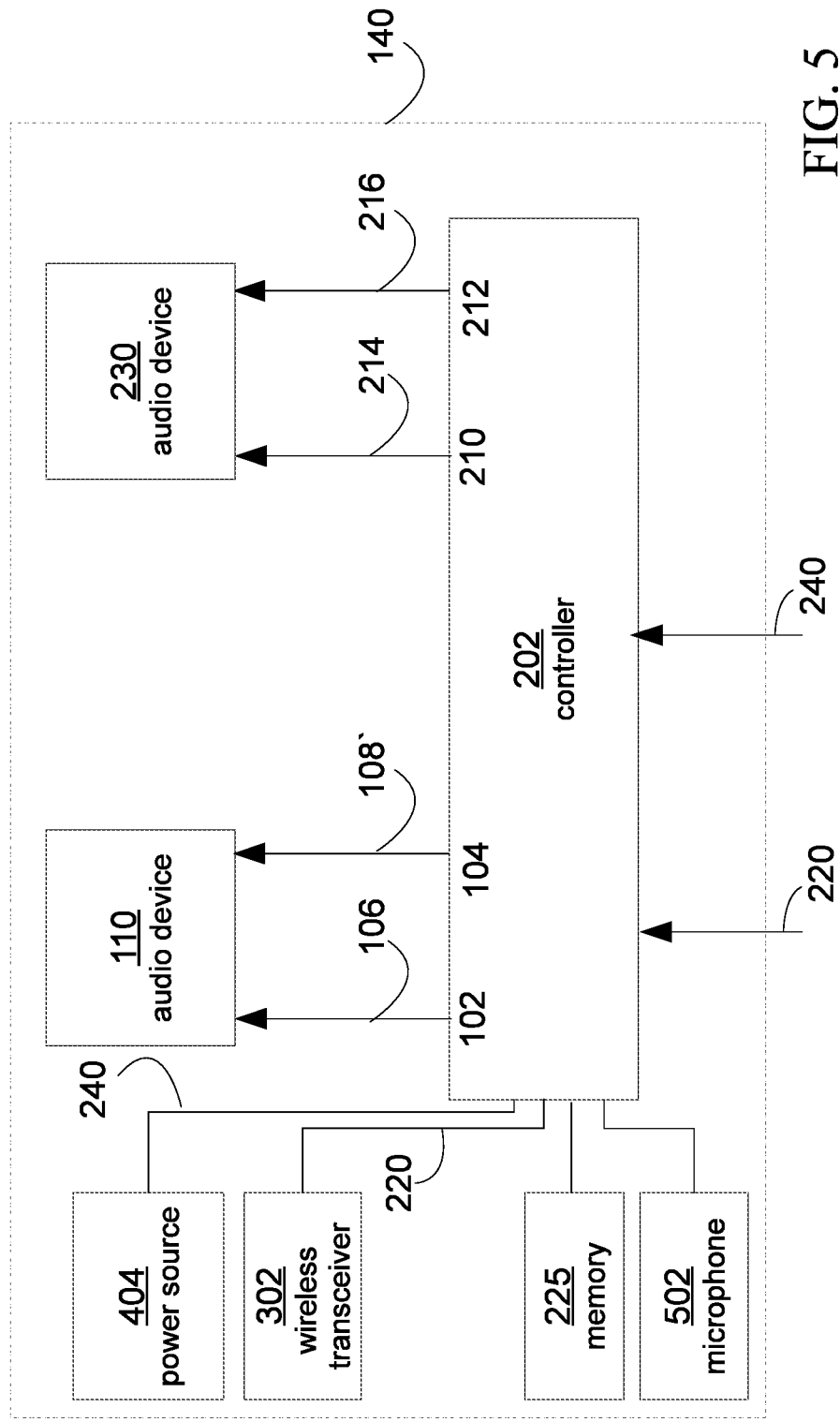
FIG. 5 is an example of digital audio device which includes a microphone

FIG. 5 is an example of digital audio device which includes one or more microphones 502 connected to the control unit 202 via an electrical connection 510. In one example, the microphone detects the audio signals in the vicinity of the audio system. In one example the microphone has a directional acoustic beam pattern, in an alternative example the microphone has an omni-directional acoustic beam pattern. In one example the microphone can be used to provide acoustic feedback to the controller 202, the actual sound generated from the acoustic transducer. The controller, 202 adjusts the drive signals to achieve a target sound characteristic. The sound characteristic can be defined by any but not limited to; the controller; the memory unit; the audio system; or the user by means of a global control unit. In another example the microphone can be used to detect background sound signal. The background sound signal can then be subtracted from audio signal by the controller. The acoustic transducer will then create an audio signal which includes a noise cancelling portion. The noise cancelling portion can also be defined by a central processing unit. In this case, the background audio signal from each device is transmitted via an electrical or wireless connection to the central unit. Using the spatially distributed background noise information from the microphones and the spatially distributed acoustic transducers, noise cancelling can be affected over an expanded spatial volume.

In another example, the unique feature of the audio generating device can be used for time multiplexing noise cancellation. In this case, the acoustic transducer is operated intermittently in a periodic manner. The period is above the audio signal region so that the effect of periodically shutting the audio signal is not discernable to the listener. A high frequency microphone, with a cut off frequency above the period can be used to detect background noise during the time when the acoustic signal is stopped. As an example, the acoustic signal output can be suppressed every 10 microseconds and at a frequency of 100 KHz and for a duration of 1 microsecond. A microphone with a cut off frequency above 100 KHz can be activated during the cutoff time and the background noise signal is measured and then can be subtracted from the generated audio to reduce the background noise.

Figure 6:
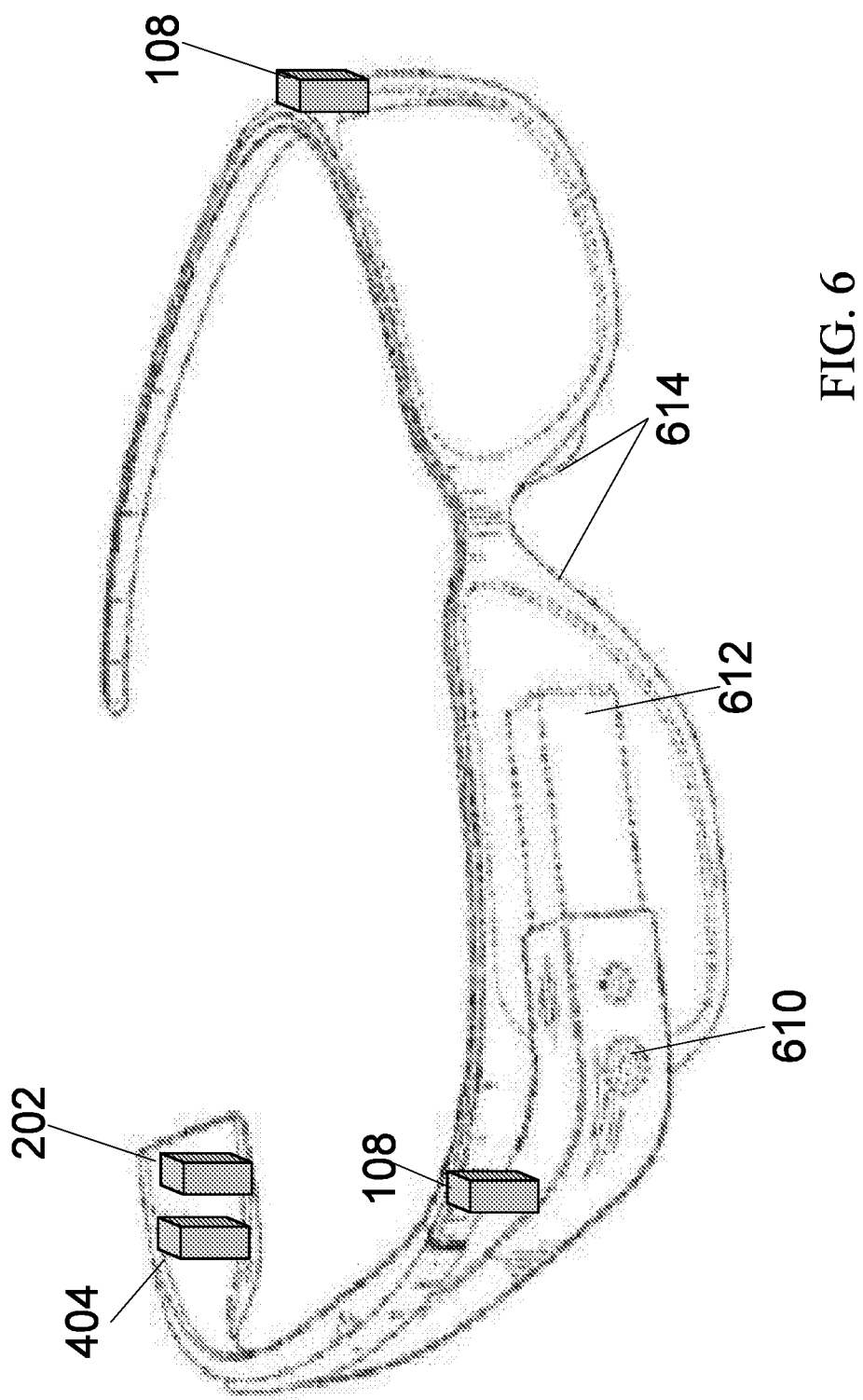
FIG. 6 Is an example of embedding an acoustic transducer control unit and power source in a wearable item.

FIG. 6 is an example of embedding an acoustic transducer 108, control unit, 202 and power source, 404 in a wearable item. Example of wearable items include but are not limited to; glasses; bracelets; straps; clothing items; hats; scarfs; shoes or combination of these. In one example the control unit 202, and power source 404 are part of an additional unit such as a control of an image sensor 610, display device, 612, sensor such as cardiac sensor 614 for which two electrodes are needed, or a GPS, magnetometer, accelerometer, and gyro or other sensing devices. In such examples the acoustic transducer has a specific acoustic beam profile which directs the generated sound towards the user's ears. In case of high fidelity sound as well as localized noise cancellation there is no need for earphones or headsets, thus allowing low profile audio devices to be included in wearable devices or clothing. As another example, the audio system is used to broadcast information from one user to another. The broadcasted information is in the audio range or in the ultrasound range. As another example an audio signal can be used for echo ranging and identifying obstacles in the path of the user. As another example, the audio generating device can be used to alert the user and augment his perception of the surroundings. In another example, the audio device can add an audio signal to the background audio signal to create an augmented audio signal which can highlight certain characteristics. As one example, a user hears a conversation and be provided with a concurrent audio translation. As another example a user can hear another user singing and the augmented song is corrected for errors.

Figure 7:
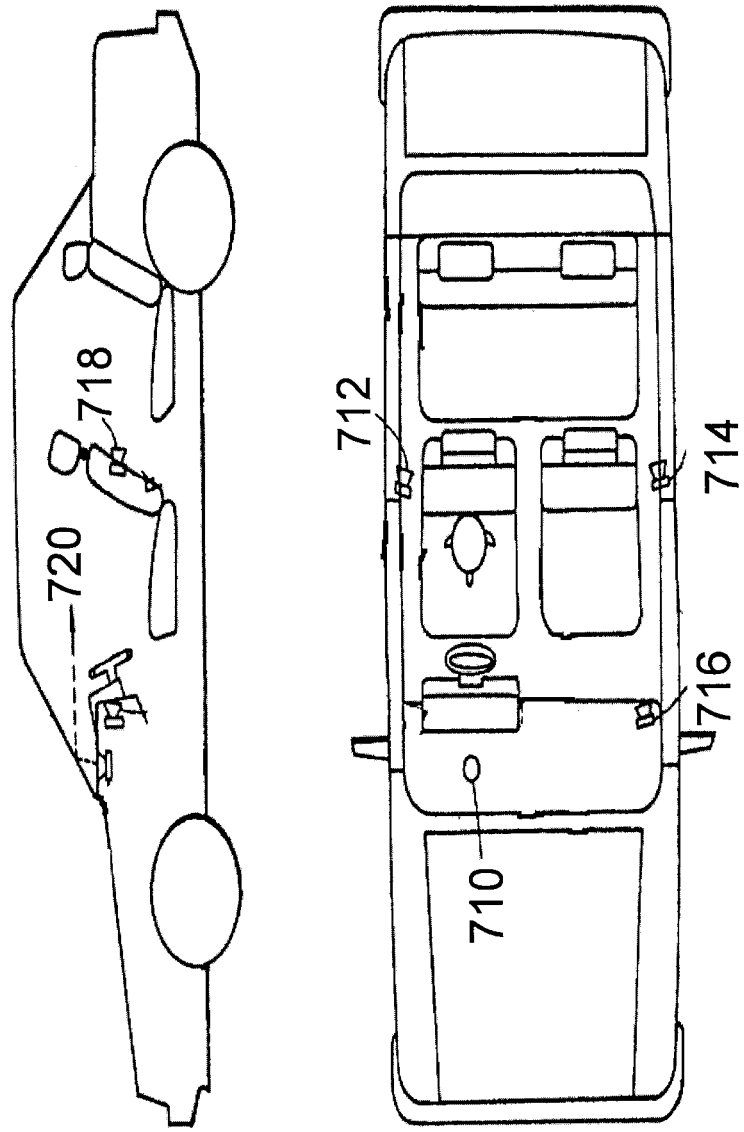
FIG. 7 Is an example of an audio system for use in an automobile.

FIG. 7 is an example of an audio system for use in an automobile; small room or similar enclosed space. Due to the small form factor of the audio generating devices, the devices are placed in many spatial locations. As an example, the audio generating devices, 710, 712, 714, 716, 718, 720, are embedded in the automobile roof, dashboard, head rests, seat sides, door brackets, the doors, or any other element of the car.

Using a digital audio generating device simplifies the required wiring and only two electrical wires are needed for each device. A power wire to provide the electrical power, and the digital signal electrical wire which provides the encoded audio streams and control signals. In one example a central unit 602 is electrically or wirelessly connected to all the devices and controls the audio signal emitted from each device. As another example, a plurality of audio generating devices 710, 712, 714, 716, 718, 720, are placed in the roof of the car. The spatial volume required for each audio generating device is only a few square mm so that they are be embedded either in the roof hyper structure or embedded during assembly of the roof lining. In another example the audio generating devices are embedded in the manufacturing process of the roof lining. The audio generating devices are connected serially on one or more power bus and communication bus. This architecture simplifies the wiring and control of the devices and enables having a very large numbers of devices controlled in a simplified manner. In another example an audio generating device 710, 712, 714, 716, 718, 720 is embedded every 10 square centimeter of roof lining. The electrical wires are put in place during the embedding or can be printed using 3D printing technology. The connection of the wire to the car infrastructure can be facilitated by plug in connectors.

In another example the audio generating devices are embedded in the car seats. In one example the embedding is done during the manufacturing process of the car seat or car seat cover. The audio generating devices are connected serially to a power bus and a communication bus. This simplifies the wiring and control of the devices and enables having very large numbers of devices in place. In another example an audio generating device is embedded every 10 square centimeter of car seat cover. The electrical wires are put in place during the embedding or can be printed using 3D printing technology. The connection of the wire to the car infrastructure is facilitated by plug in connectors. In another example the devices are embedded in the head rests of the seats. In another example, the audio generating devices are embedded in the dashboard during manufacturing of the dashboard or during assembly of the dashboard the audio generating devices are introduced into specific holes or recesses in the dashboard. The devices may be further embedded in the car doors, car door frames, or in any metal, plastic or textile element of the car. In a further example the devices are embedded during manufacture or the car element or during assembly of the car element. In another example the audio generating devices are embedded or attached to the windows of the car. Since the devices have very low mass, small volume and nearly zero vibrations at low frequency, they are unobtrusive on the windows. To reduce any aspects of appearance in the windows, the devices are equipped with a wireless connection and battery and are remotely controlled without wires.

In another example a plurality of audio generating devices are operated to produce a directional beam of sound. In this example, each of the devices emits a phase delayed replica of the same audio stream. The phase delay between the devices controls the direction of the beam. By having a plurality of devices spread along a continuous area such as the car roof, window, door or other area, the resulting sound can be highly directional. In one example the audio generating system includes a plurality of audio generating devices create a different audio experience for each passenger. As an example, a beam directed to the driver contains audio of one song, while a beam directed to the passenger next to him contains audio of a second song, and third beam directed at the backseat passenger contains audio of a news cast. In a further example, the generated beams are controlled by embedded microphones either in the audio generating units or as standalone devices. In this example, the current method of controlling the power of the speakers is replaced with a control of the beam, and audio content of each beam. In such a system, the user can control the direction of the beam, its dimensions and the audio content. Two or more users can share the same enclosure but have a different audio experience. In a further example the devices have specific characteristics predefined in a local memory unit or defined by the control signals from a central control unit. As an example, an audio stream is modified at the digital or analog level before being applied as a driver signal to the acoustic transducer. The audio stream is modified by a specific command which is transmitted before or during the audio stream. Examples of commands include but are not limited to

- The amplitude or volume of the audio stream is increased or decreased
- The spectrum of the audio stream is modified, where the amplitude of each frequency or group of frequencies is increased or decreased. This is similar to an equalizer function. Since the audio transducer has a flat frequency response, the spectrum manipulations can be used to mimic specific characteristics of musical instruments, musical types, or of legacy analog audio equipment.
- Non-linear effects such distortion, clipping, harmonic generation and other non-linear signal aspects applied to the audio stream
- time or phase delays, as well as echo or time delayed replications, or time dependent changes in the audio stream such as fading.

These examples and others can be applied by the control to the stream prior to driving the acoustic transducer. Alternatively, these can be applied after the controller creates the analog drive signal. In an example, the control of the audio stream is defined by the control commands. In another example, the control of the audio stream is also controlled at each audio generating device by the characteristics maintained in the device memory. In one example these characteristics are defined during manufacture or in an alternative example are programmed during device operation through the control commands. In this manner an audio generating device is programmed to produce sound in a specific manner and with certain characteristics. In one example a device is programmed to mimic a specific musical instrument, music style or vintage musical player.

In one example, noise cancellation is implemented at each device by using a local microphone and subtracting the background noise signal from the generated audio signal. In an alternative example an electrical connection 630 between the microphone and audio generating device will multiplex the background noise signals from all the devices and provide the control system with the spatial background noise. The controller individually controls each spatially distributed audio generating device to reduce the background noise. In an alternative example the generated audio signal is used to augment the background audio signal.

Figure 8A:
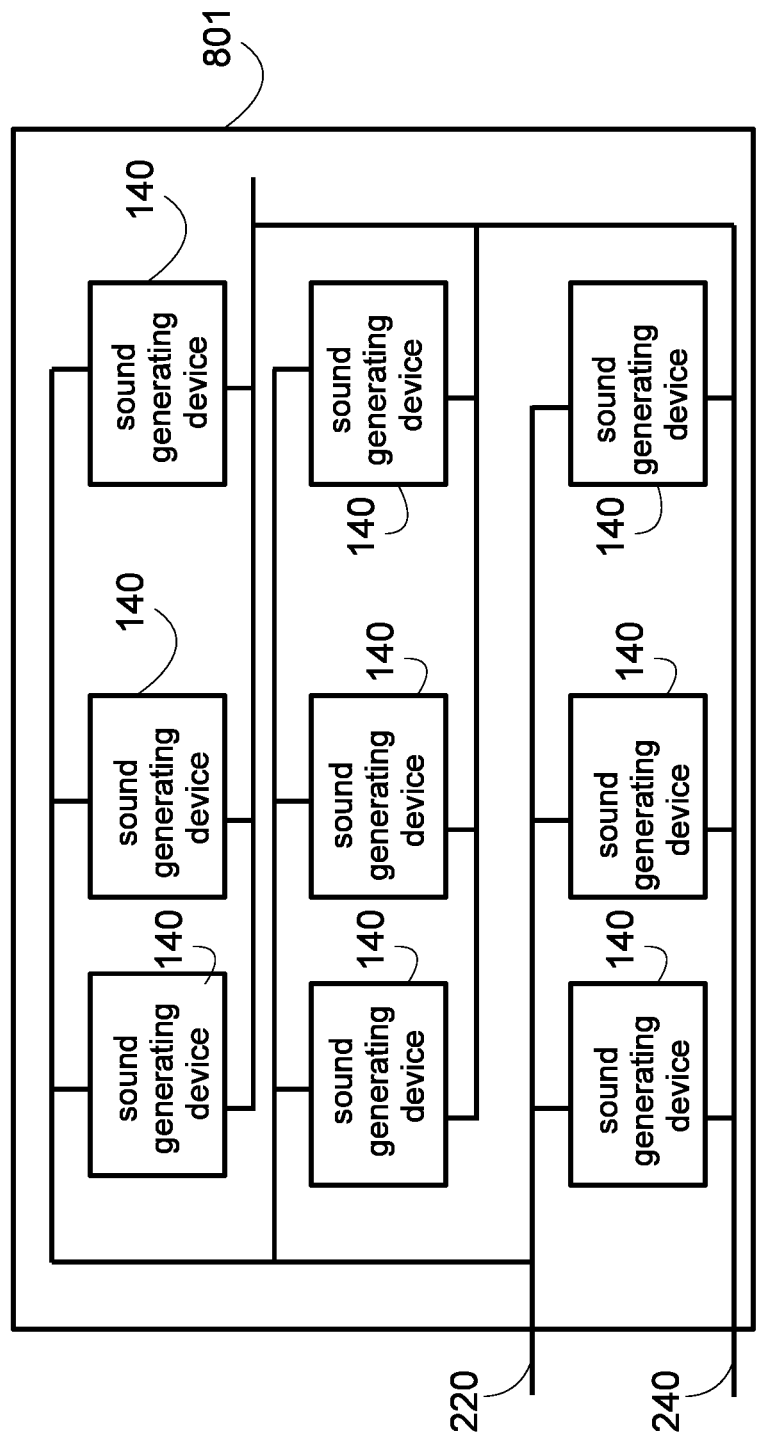
FIG. 8A is an example of a schematic of an audio unit which includes two or more sound generating devices.

FIG. 8A is an example of a schematic of an audio unit 801 which includes two or more sound generating devices 140. Examples of audio systems include but are not limited to stereo speaker systems; portable speakers; personal assistants and speakers of personal assistants; sound bars; large scale audio systems; home theater systems; surround speaker systems; speakers in TVs, portable speakers laptops; tablets; or other consumer electronic devices. Each sound generating device a unique identifying code and at least but not limited to two electrical connections. One connection provides a communication bus 220 and a second connection provides a power bus 240. The communication bus is any of but not limited to a two wire differential system; a single wire system; serial bus system; parallel bus system; I2S; I2C; USB; VXI; PCI; CAN bus or similar protocols or connections. The power bus 240 is any of but not limited to a single wire electrical connection; two wire differential connection. Examples of voltages include but are not limited to 3V; 5V; 12V; 48 V; any voltage between 3-12 V; any voltage between 12-48V; AC voltage of 110 V; AC voltage of 220V. In one example a plurality of sound generating devices (140) are arranged in a geometric layout designed to provide a target spatial distribution of an audio beam. Examples of layouts include but are not limited to; a rectangular layout with m by n sound generating devices where m is the number of devices in one axis and n is the number of sound generating devices in a second axis; a ring layout where a plurality of sound generating devices (140) are positioned along a ring with radius R; a circular layout composed of k multiple rings with Radii R1, R2, to Rk; a strip; randomly in an area. In a further example a sound generating device (140) has a unique ID and receives an individual audio stream or audio related commands. In one example, one sound generating device generates one sound signal and second sound generating device generates a second sound signal where the sound signals differ in any of but not limited to; content; frequency content; timber; chirp; bass; treble; spectral amplification; reverberation; phase; delay; volume; harmonics; or any other sound characteristic. In a further example the audio system provides a spatially directed beam; a time varying moving beam; a content dependent spatially directed beams; mechanisms for augmented sound; noise reduction and enhancement.

FIG. 8B is a further example of the schematic of an audio unit 801 which includes a power unit 805 connected to the power bus 240 and a control unit 803 connected to the communication bus 220. The control unit 803 receives an audio input from an audio source. Examples of audio source include but are not limited to; stereo system; cellphone; internet; radio; TV; proprietary or general wireless protocol such as WiFi; Bluetooth; Zigbee; microphone; CD; tape; or any other system generating a digital or audio signal. The power supply 805 is connected to any of but not limited to the following voltages; 3V; 5V; 12V; 48 V; and voltage between 3-12 V; any voltage between 12-48V; AC voltage of 110 V; AC voltage of 220V. The power supply 85 provides the required voltage and current for operating the sound generating devices 140. In a further example the control unit includes a memory unit; a recording unit; a communication unit; one or more microphones; an audio processing unit;

FIG. 9 is an example of side view of an audio system 901, composed of at least an audio unit 905; acoustic augmentation unit 903; and frame 901. In a further example the acoustic augmentation unit 903 provides an acoustic channel for each sound generating device 140 FIG. 8A, optimizing the acoustic coupling between the sound generating device 140 FIG. 8A and the surrounding medium. In a further example, the acoustic augmentation unit 903 provides coupling between sound generating devices 140 in FIG. 8A. Said coupling enhances the mixing of the sound generating devices 140 in FIG. 8A and provides a uniform large area sound source. In a further example the acoustic augmentation unit 903 provides acoustical filtering to enhance certain sound frequencies or traits.

Figure 10:
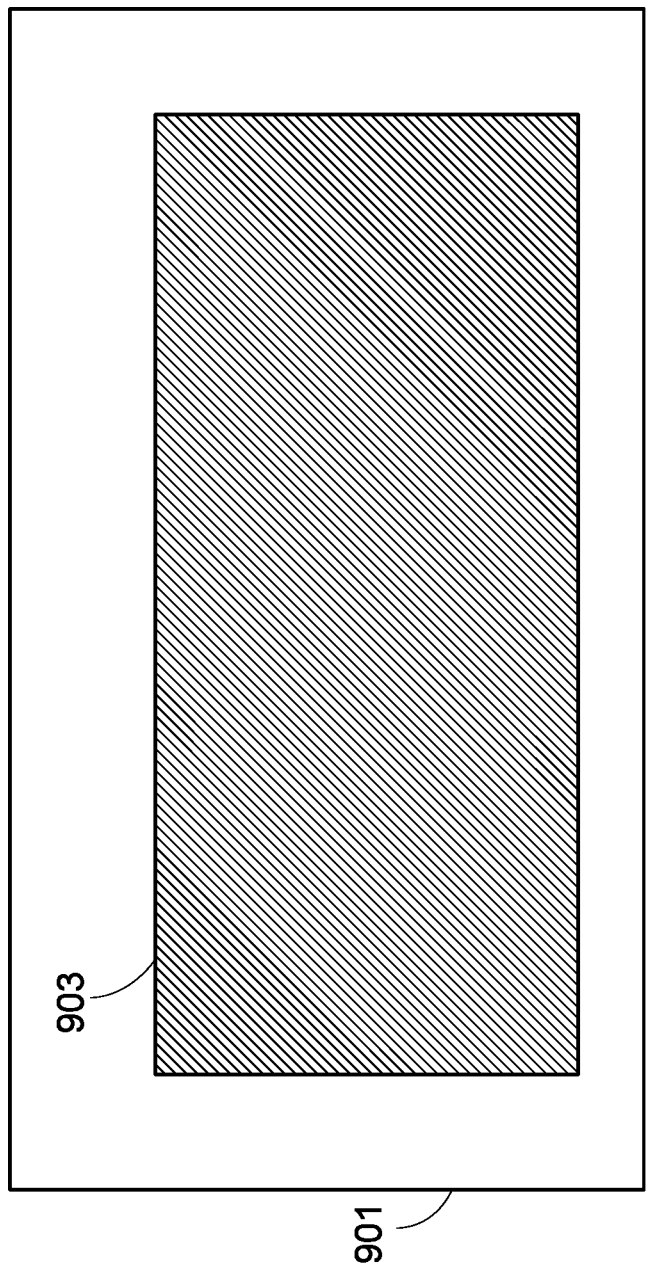
FIG. 10 is an example of a top view of an audio system.

FIG. 10 is an example of a top view of an audio system which includes a top view of a frame 901 and an acoustic augmentation unit 903.

Figure 11:
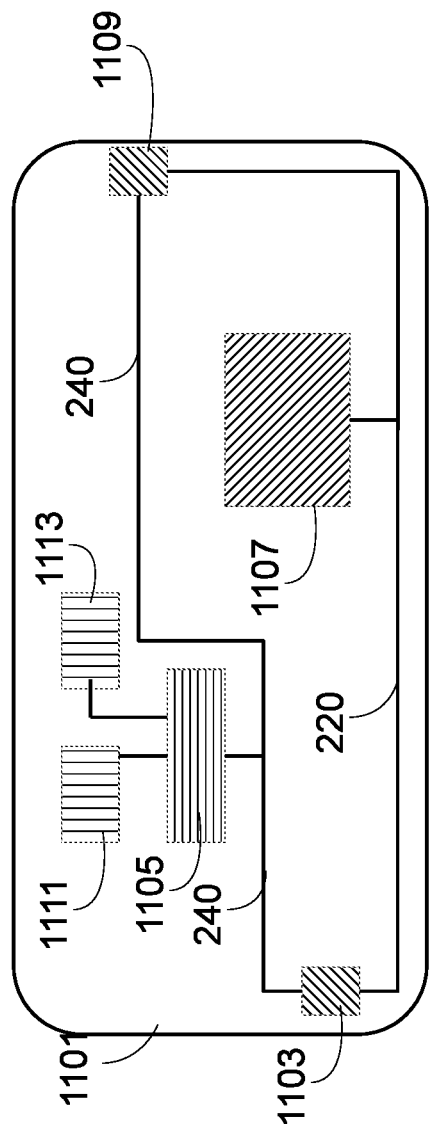
FIG. 11 is an example of a phone with one or more sound generating devices.

FIG. 11 is an example of a phone 1101 with one or more sound generating devices 1103, 1109. In one example at least one sound generating device 1103 is used for generating sound in close proximity to the ear. In a second example at least one sound generating device 1104 is used for generating sound with a max SPL of any of but not limited to 90 dB; 85 dB; 70 dB; and SPL between 50-100 dB. Examples of use of sound generating devices include; speakerphone; voice conversation; music; soundtracks. In addition to the sound generating devices 1103, 1109, the phone further includes a communication bus 220, a power bus 240, a battery 1107, a controller 1105, a memory device 1111, a communication unit 1113. In one example the controller 1105 is the phone main processor. In a further example the sound generating devices 1103, 1109 include an acoustic port which connects the sound generating device 1103, 1109 to the surrounding medium. The acoustic port provides any of the following functions but not limited to; acoustic filtering; sound augmentation; protection from humidity; protection from dust; protection from water or other liquids. Examples of phones include; cellphones; wireless phones; phablets; smartphones; tablets; and any device which is used to communicate with one or more persons.

Figure 12:
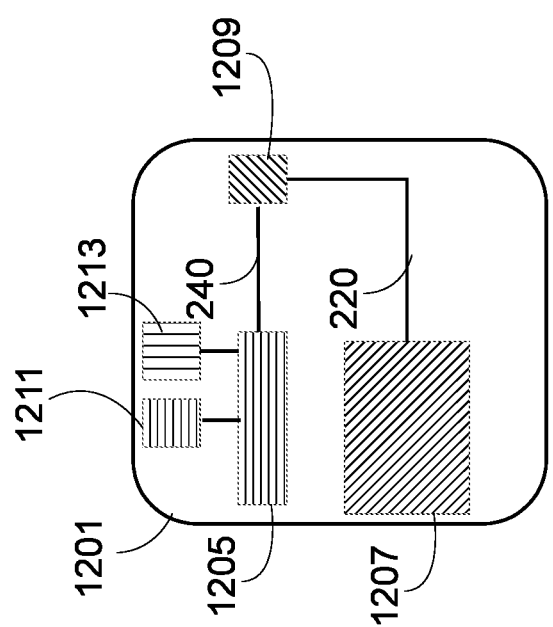
FIG. 12 is an example of a wearable device with one or more sound generating devices.

FIG. 12 is an example of a wearable device 1201 with one or more sound generating devices 1203. In one example at least one sound generating device 1209 is used for generating sound with a max SPL of any of but not limited to 90 dB; 85 dB; 70 dB; and SPL between 50-100 dB. Examples of use of sound generating devices include; speakerphone; voice conversation; music; soundtracks. In addition to the sound generating devices 1209 the phone further includes a communication bus 220, a power bus 240, a battery 1207, a controller 1205, a memory device 1211, and a communication unit 1213. In one example the controller 1205 is the wearable device main processor. In a further example the sound generating devices 1209 includes an acoustic port which connects the sound generating device 1209 to the surrounding medium. The acoustic port provides any of the following functions but not limited to; acoustic filtering; sound augmentation; protection from humidity; protection from dust; protection from water or other liquids. Examples of wearable devices include; smart watch; tracking device; wristband; health tracking device; electronic watch; chest band.

Figure 13:
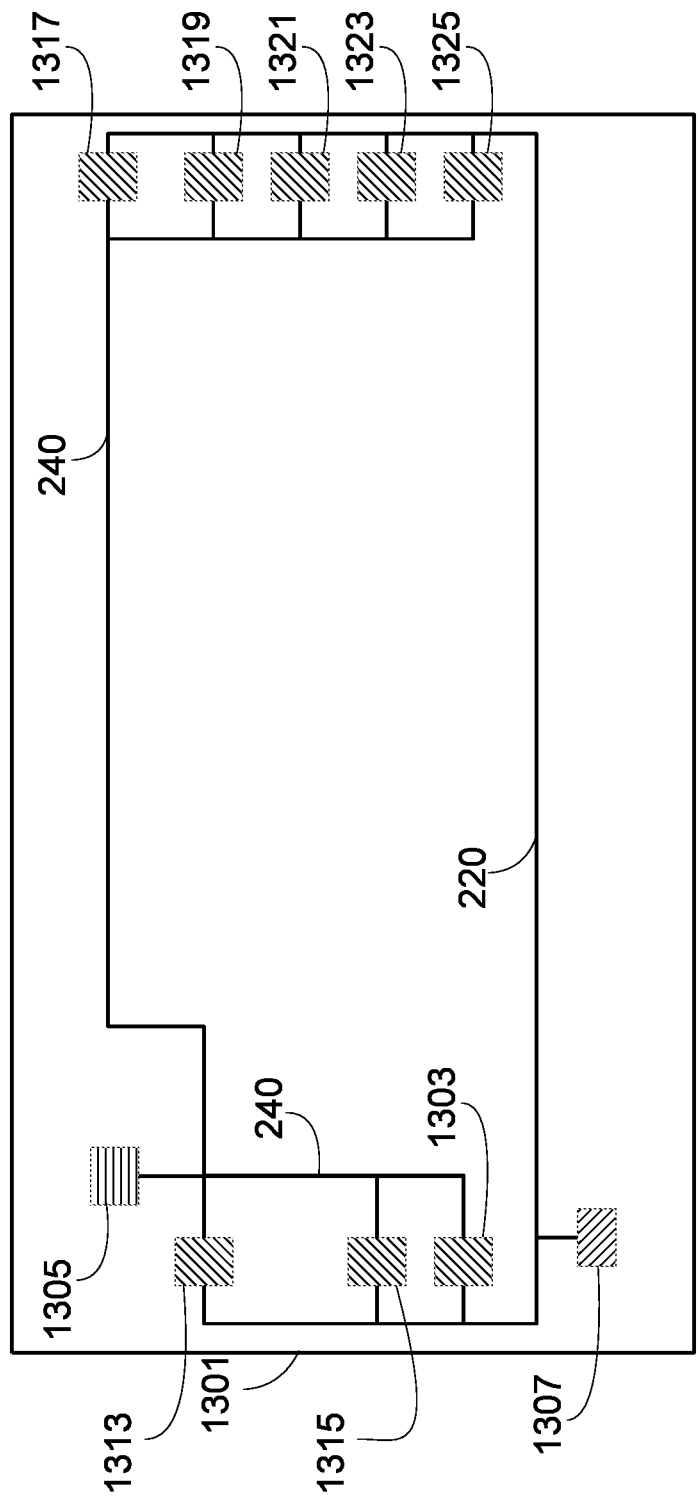
FIG. 13 is an example of a TV or other large screen device with one or more sound generating devices.

FIG. 13 is an example of a TV or other large screen device 1301 with one or more sound generating devices 1313, 1315, 1317, 1319, 1321, 1323, 1325. In one example at least one sound generating device is used for generating sound with a max SPL of any of but not limited to 90 dB; 85 dB; 70 dB; and SPL between 50-100 dB. In addition to the sound generating devices the TV further includes a communication bus 220, a power bus 240, a power source 1305, and controller 1307. In a further example the TV includes also a memory device and a communication unit. In one example the controller 1307 is the TV main processor and the power source 1305 is the TV power source. In a further example the sound generating devices 1313, 1315, 1317, 1319, 1321, 1323, 1325 include an acoustic port which connects the sound generating device to the surrounding medium. The acoustic port provides any of the following functions but not limited to; acoustic filtering; sound coupling from other sound generating devices; sound augmentation; protection from humidity; protection from dust; protection from water or other liquids. The location of the sound generating devices on the TV can be any of but not limited to; spread along the frame; spread along the frame facing the wall, in specific locations at the backside of TV; behind cover glass and using the glass as an acoustic transmission medium.

Figure 14:
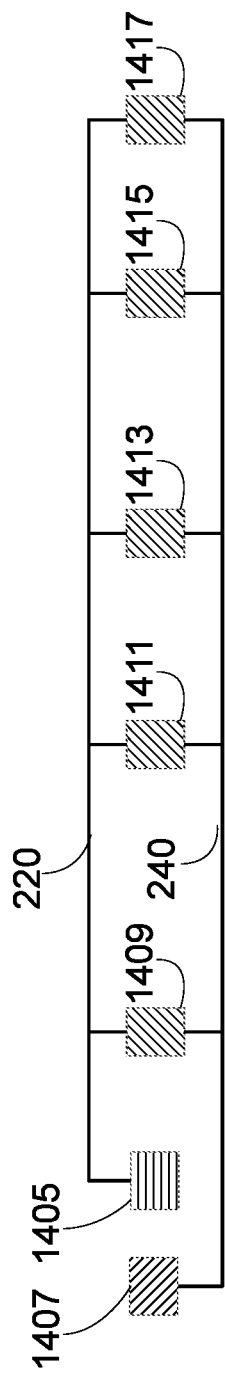
FIG. 14 is an example of a sound strip with one or more sound generating devices.

FIG. 14 is an example of a sound strip with one or more sound generating devices 1409, 1411, 1413, 1415, 1417. In one example at least one sound generating device is used for generating sound with a max SPL of any of but not limited to 90 dB; 85 dB; 70 dB; and SPL between 50-100 dB. In addition to the sound generating devices the sound strip further includes any of but not limited to; a communication bus 220, a power bus 240, a power source 1405, and a controller 1407. In a further example the sound strip further includes any of but not limited to a memory device; a communication unit. In a further example the sound generating devices include an acoustic port which connects the sound generating device to the surrounding medium. The acoustic port provides any of the following functions but not limited to; acoustic filtering; sound coupling from other sound generating devices; sound augmentation; protection from humidity; protection from dust; protection from water or other liquids. In a further example the strip includes a flexible substrate one which the acoustic transducers, power bus and communication buses are mounted. Examples of flexible substrates include flex PCB or other electronic laminates. The strip is further coated with a top side protection material such as Silicone or epoxy. In one example the acoustic ports are not covered to provide adequate sound transmission. In an alternative example the acoustic ports are covered with an acoustically transparent cover which provides protection from any of but not limited to humidity; water; dust. Examples of locations where the strip might be affixed to include but are not limited to a wall; car; elevator; door; hung; floor; ceiling. In a further example the strip includes microphones which are used to detect the sound and provide any off but not limited to; noise reduction; sound augmentation.

Figure 15A:
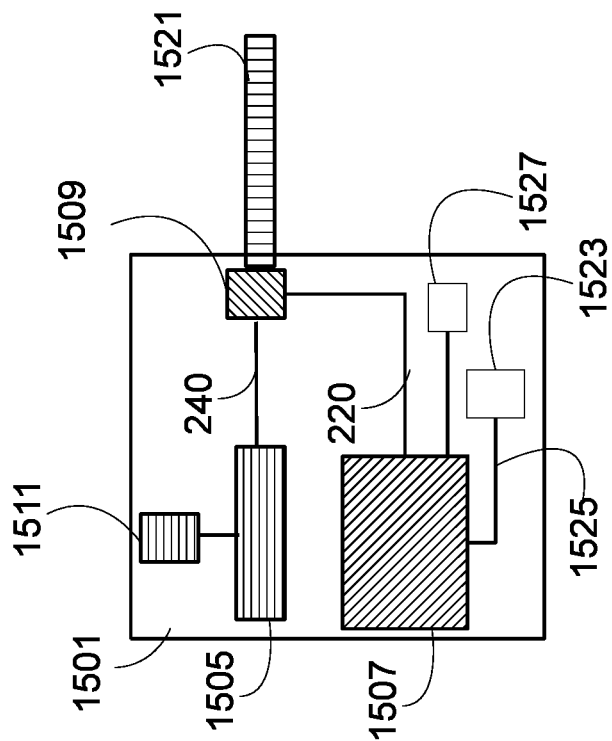
FIG. 15A is an example of a hearing aid device or noise cancelling headphone.

FIG. 15A is an example of a hearing aid device or noise cancelling headphone 1501 with one or more sound generating devices 1509. In one example at least one sound generating device 1509 is used for generating sound with a max SPL of any of but not limited to 90 dB; 85 dB; 70 dB; and SPL between 50-100 dB. In addition to the sound generating device the hearing aid further includes any of but not limited to; a communication bus 220, a power bus 240, a power source 1505, and a controller 1507, which connected to a microphone. Alternatively, the microphone provides a digital audio signal and is connected to communication bus 220. In a further example the controller is connected to communication module 1527. In a further example the power source include a power control chip and a battery 1511. The sound generating device 1509 is connected to an acoustic port 1521 which is designed to optimize the coupling of the sound into the ear. The acoustic port provides any of the following functions but not limited to; acoustic filtering; sound coupling from other sound generating devices; sound augmentation; protection from humidity; protection from dust; protection from water or other liquids. The hearing device 1501, detects sounds from the microphone, optionally process the sounds or augments it and transmits the sound through the sound generating device 1509. In a further example a hearing aid device 1501 further includes additional sensors including but not limited to; heart rate sensor; blood pressure sensor; other body monitoring sensors. In a further example said sensor input is used to change the sound characteristics, where sound characteristics include but are not limited to; content; frequency content; timber; chirp; bass; treble; spectral amplification; reverberation; phase; delay; volume; harmonics; or any other sound characteristic. In a further example the communication module provides a wireless connection to an electronic device which transmits any of but not limited to; audio content; augmented audio content; audio generation characteristics.

Figure 15B:
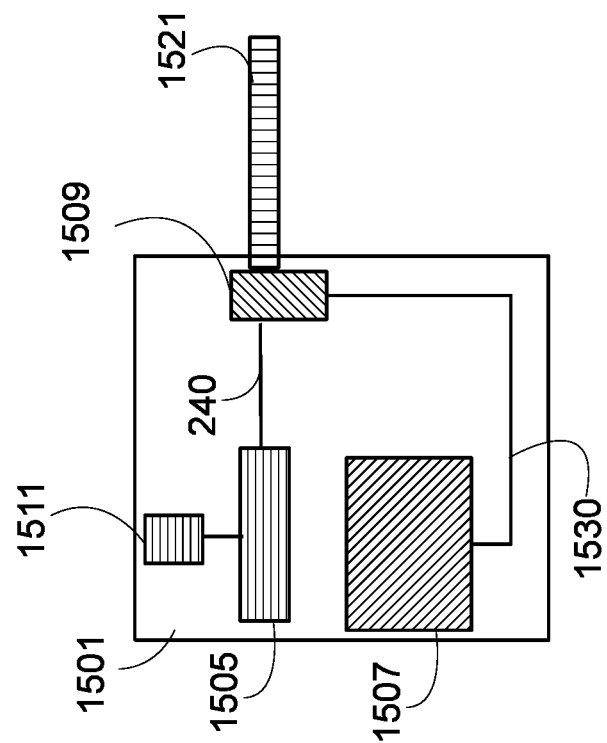
FIG. 15B is an example of headphone or earphone device 1501 with one or more sound generating devices.

FIG. 15B is an example of headphone or earphone device 1501 with one or more sound generating devices 1509. In one example at least one sound generating device 1509 is used for generating sound with a max SPL of any of but not limited to 90 dB; 85 dB; 70 dB; and SPL between 50-100 dB. In addition to the sound generating device the hearing aid further includes any of but not limited to; a communication bus 220, a power bus 240, a power source 1505, and a controller 1507. In a further example the controller is connected to communication module 1527. In a further example the power source include a power control chip and a battery 1511. The sound generating device 1509 is connected to an acoustic port 1521 which is designed to optimize the coupling of the sound into the ear. The acoustic port provides any of the following functions but not limited to; acoustic filtering; sound coupling from other sound generating devices; sound augmentation; protection from humidity; protection from dust; protection from water or other liquids. In a further example a hearing aid device 1501 further includes additional sensors including but not limited to; heart rate sensor; blood pressure sensor; other body monitoring sensors. In a further example said sensor input is used to change the sound characteristics, where sound characteristics include but are not limited to; content; frequency content; timber; chirp; bass; treble; spectral amplification; reverberation; phase; delay; volume; harmonics; or any other sound characteristic. In a further example the communication module provides a wireless connection to an electronic device which transmits any of but not limited to; audio content; augmented audio content; audio generation characteristics.

Figure 16A:
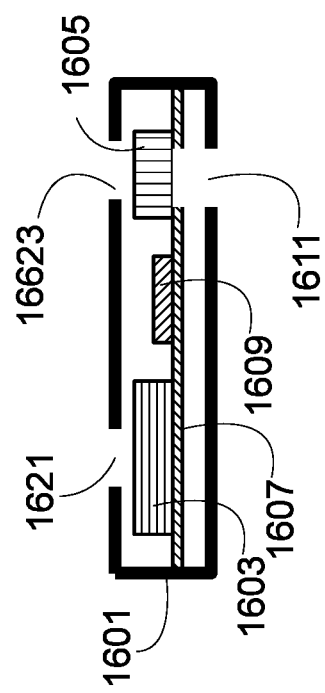
FIG. 16A is an example of a side view of integrated sound unit.

In several types of devices including but not limited to; hearing aids; noise cancelling earphones; augmented sound device; noise cancelling devices; reactive devices; feedback devices, the acoustic transducer requires a microphone. FIG. 16A is an example of a side view of integrated sound unit which includes at least a sound generating device co-packaged with a microphone. In one example the integrated sound unit includes a substrate or laminate 1607 providing electrical connections; a sound generating device 1603; a microphone 1605; an electronic integrated circuit 1609 all of which are assembled and electrically connected to said laminate 1607; a package 1601 encapsulating said laminate 1607 and assembled components. In a further example the package 1601 includes at least one acoustic aperture 1621, 1623, 1611. In a further example the acoustic apertures are located above or below any of the sound generating device 1603; microphone 1605. In one example an acoustic aperture 1621 is located above the sound generating device 1603. In an additional example an acoustic aperture 1623 is located above the microphone 1605. In a further example an additional acoustic aperture 1611 is located below the microphone 1603.

Figure 16B:
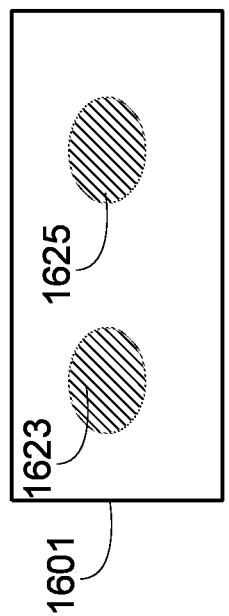
FIG. 16B is an example of a top view of an integrated sound unit.

FIG. 16B is an example of a top view of an integrated sound unit with a package 1601 and acoustic apertures 1623 and 1625. In a further example the acoustic apertures include any of but not limited to a film; foam; fabric; any other material or material composition enabling the low loss transmission of sound while preventing entry of dust; humidity; liquids or combinations of these. Examples of materials include Gore vents and other fabrics or non-woven materials.

Figure 16C:
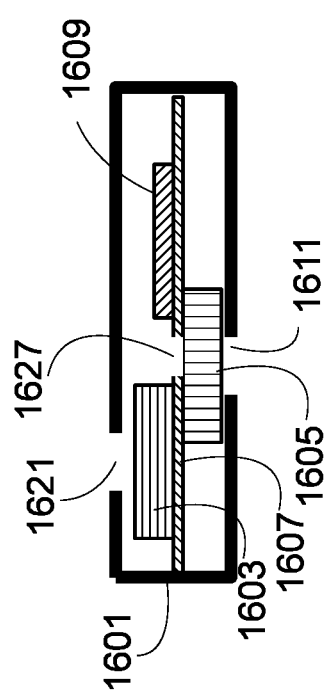
FIG. 16C is an additional example of a side view of integrated sound unit; all arranged in accordance with at least some embodiments of the present disclosure.

FIG. 16C is an additional example of a side view of integrated sound unit which includes at least a sound generating device co-packaged with a microphone. In one example the integrated sound unit includes a laminate 1607 providing electrical connections; a sound generating device 1603; a microphone 1605; an electronic integrated circuit 1609 all of which are assembled and electrically connected to said laminate 1603; a package 1601 encapsulating said laminate 1607 and assembled components. In a further example the sound generating device 1603; electronic integrated circuit 1609; and microphone 1605 are assembled on either side of the laminate. In a further example the package 1601 includes at least one acoustic aperture 1621, 1623, 1611. In a further example the acoustic apertures are located above or below any of the sound generating device 1603; microphone 1605. In one example an acoustic aperture 1621 is located above the sound generating device 1603. In an additional example an acoustic aperture 1627 is located below the microphone 1605. In a further example an additional acoustic aperture 1627 is located in the laminate above the microphone 1603. In a further example the microphone is realized as one of the membranes of the sound generating device. Examples of membranes used for sensing sound or ultrasound include but are not limited to; blind membrane; shutter membrane; other conducting or partially conducting membranes. In an alternative example the membranes generating sound or ultrasound are used for sensing sound or ultrasound. In this example the electronic integrated circuit driving the acoustic transducer includes a capacitive sensing mechanism which detects changes in capacitance. The changes in capacitance relate to changes in membrane displacement due to sound pressure levels. In a further example static changes in the capacitance of the acoustic transducer provide an indication of the static air pressure and hence the acoustic transducer is used to detect air pressure as well as sound.

In one example, an audio system is composed of at least one sound generation device which includes at least but not limited to an acoustic transducer; an electronic integrated circuit; a communication bus connected to the at least one sound generation device and communicating a digital signal comprised of one or more audio streams and control signals;

a power bus connected to the at least one sound generation device; wherein the acoustic transducer includes at least a membrane and an acoustic modulator; or a membrane, acoustic resonator and acoustic coupler; and wherein the electronic integrated circuit receives the digital signal and generates an analog electric signal to operate the acoustic transducer to generate an audio signal in accordance with the control signal. In further example the electronic circuit includes a wireless transceiver. In a further example the digital signal is transmitted via a wireless transmission.

In an alternative example, an audio system includes at least one acoustic transducer wherein the acoustic transducer includes at least a membrane and an acoustic modulator; or a membrane, acoustic resonator and acoustic coupler; at least one microphone receiving an audio signal; a least one electronic integrated circuit connected to the acoustic transducer and microphone; a digital signal comprised of one or more audio streams and control signals; a communication bus connected to the at least one electronic integrated circuit and communicating a digital signal comprised of one or more audio streams and control signals; a power bus connected to the at least one sound generation device; wherein the electronic integrated circuit receives the digital signal and generates an analog electric signal to operate the acoustic transducer to generate an audio signal in accordance with the control signal and in relation to the microphone signal. In a further example the electronic integrated circuit includes a wireless transceiver. In a further example an audio signal received from a microphone is used by the audio system for background noise cancellation. In a further example the digital signal is transmitted via a wireless transmission. In a further example an audio signal from the microphone is used for feedback on the generated acoustic signal. In a further example the audio system is embedded in a wearable element such as scarf, band, glasses, hat, or shirt. In a further example the acoustic signal from the microphone is used for any of but not limited to; measuring location using acoustic echo location; gesture recognition; face recognition; fingerprint recognition; measuring distance.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to disclosures containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. An audio system comprising:
   at least one sound generation device comprising at least an acoustic transducer and an electronic integrated circuit;
   a communication bus connected to the at least one sound generation device and configured to communicate a digital signal comprised of one or more audio streams and control signals; and
   a power bus connected to the at least one sound generation device;
   wherein the acoustic transducer includes at least one of the following groups: a membrane and an acoustic modulator; or a membrane, acoustic resonator, and acoustic coupler, and
   wherein the electronic integrated circuit is configured to receive the digital signal and generate an ultrasound analog electric signal to operate the acoustic transducer to generate an audio signal in accordance with the control signal.

2. The audio system according to claim 1, wherein the electronic circuit includes a wireless transceiver.

3. The audio system according to claim 2, wherein the digital signal is transmitted via a wireless transmission.

4. An audio system comprising:
   at least one acoustic transducer, wherein the acoustic transducer includes at least one a group of: a membrane and an acoustic modulator; or a membrane, an acoustic resonator, and an acoustic coupler;
   at least one microphone receiving an acoustic signal;
   at least one electronic integrated circuit connected to the acoustic transducer and microphone;
   a digital signal comprised of one or more audio streams and control signals;
   a communication bus connected to the at least one electronic integrated circuit and communicating a digital signal comprised of one or more audio streams and control signals; and
   a power bus connected to the at least one sound generation device;
   wherein the electronic integrated circuit is configured to receive the digital signal and generate an ultrasound analog electric signal to operate the acoustic transducer to generate an audio signal in accordance with the control signal and in relation to an acoustic signal received from a microphone.

5. The audio system according to claim 4, wherein the electronic circuit includes a wireless transceiver.

6. The audio system according to claim 4, wherein the acoustic signal from the microphone is used for background noise cancellation.

7. The audio system according to claim 4, wherein the digital signal is transmitted via a wireless transmission.

8. The audio system according to claim 4, wherein the acoustic signal from the microphone is used for feedback on the generated audio signal.

9. The audio system according to claim 4, wherein the audio system is embedded in a wearable element such as scarf, band, glasses, hat, or shirt.

10. The audio system according to claim 4, wherein the acoustic signal from the microphone is used for at least one of: measuring location using acoustic echo location; gesture recognition; face recognition; fingerprint recognition; or measuring distance.

11. The audio system according to claim 4, wherein the audio system generates an audio signal to at least one of an earphone; headset; hearable; headphone; or hearing aid.

12. One or more audio systems according to claim 4, wherein the audio system is configured to generates an audio signal in at least one of: a cellphone; a TV; an automobile; a portable speaker; and a tablet.

* * * * *